(12) United States Patent
Perichon

(10) Patent No.: US 10,317,454 B2
(45) Date of Patent: Jun. 11, 2019

(54) ELECTRIC ARC DETECTION

(71) Applicant: Commissariat à l'Énergie Atomique et aux Énergies Alternatives, Paris (FR)

(72) Inventor: Pierre Perichon, Voiron (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 173 days.

(21) Appl. No.: 15/105,533

(22) PCT Filed: Dec. 8, 2014

(86) PCT No.: PCT/EP2014/076922
§ 371 (c)(1),
(2) Date: Jun. 16, 2016

(87) PCT Pub. No.: WO2015/091071
PCT Pub. Date: Jun. 25, 2015

(65) Prior Publication Data
US 2016/0320442 A1 Nov. 3, 2016

(30) Foreign Application Priority Data

Dec. 17, 2013 (FR) ..................................... 13 62789

(51) Int. Cl.
*G01R 31/12* (2006.01)
*B60L 3/00* (2019.01)
*H02H 1/00* (2006.01)

(52) U.S. Cl.
CPC ............ *G01R 31/1209* (2013.01); *B60L 3/00* (2013.01); *H02H 1/0023* (2013.01)

(58) Field of Classification Search
None
See application file for complete search history.

(56) References Cited

U.S. PATENT DOCUMENTS 4,621,532 A * 11/1986 Takagi ................. B08B 9/0551
324/220
2015/0061696 A1 3/2015 Dahmani et al.

FOREIGN PATENT DOCUMENTS

WO WO 97/24742 A1 7/1997

OTHER PUBLICATIONS

Translation of the Written Opinion of the International Searching Authority, dated Jan. 13, 2015, from corresponding International Application No. PCT/EP2014/076922.
International Search Report, dated Jan. 13, 2015, from corresponding International Application No. PCT/EP2014/076922.
Zhao et al. "Substation Monitoring by acoustic emission techiniques," (2001) IEE Proceedings: Science, Measurement, and Technology; pp: 28-34.

(Continued)

*Primary Examiner* — Paresh H Patel
(74) *Attorney, Agent, or Firm* — Wolf, Greenfield & Sacks, P.C.

(57) ABSTRACT

A method for detecting electric arcs in a closed chamber having no openings larger than 5 mm and defining a gas volume to be monitored. The method includes a step of measuring a sound level captured by a microphone, placed inside the chamber, at frequencies greater than about 60 kHz while filtering out the lower frequencies, and a step of comparing the level with a threshold.

14 Claims, 3 Drawing Sheets

(56) References Cited

OTHER PUBLICATIONS

Chengqiang et al.: "The Partial Discharge Locating Experimental Study in Transformer Based on ultrasonic Phased Array," (2012) Power and Energy Engineering Conference; Asia-Pacific IEEE; pp: 1-5.

Thayoob et al.: "Detection of acoustic emission signals from partial discharge sources in oil-pressboard insulation system," (2010) IEEE Student Conference ON; pp. 381-386.

* cited by examiner

ELECTRIC ARC DETECTION

CROSS-REFERENCE TO RELATED APPLICATIONS

This application is the national phase of International Application No. PCT/EP2014/076922, filed on Dec. 08, 2014, which claims priority to French patent application 13/62789, filed on Dec. 17, 2013, both of which applications are hereby incorporated by reference to the maximum extent allowable by law.

BACKGROUND

The present description generally relates to systems of protection against electric arcs and, more particularly, to the detection of electric arcs. The present description more particularly applies to the detection of electric arcs in a closed environment.

DISCUSSION OF THE RELATED ART

In any electric system, be it a power generation system such as, for example, a solar power plant, a power storage system, such as for example a battery assembly, a power conversion system such as for example a transformer, a transport system, such as a cable assembly, etc., the occurrence of electric arcs is particularly prejudicial. An electric arc may cause damage not only to the actual system, but may further cause significant collateral damage, such as, for example, a fire.

It has long been desired to reliably detect the occurrence of an electric arc.

A plurality of solutions using either a current and voltage measurement, or an optical radiation measurement, or an electromagnetic field measurement, has already been provided. All these methods have the disadvantage of being dedicated to a specific application and of not being transposable to other systems.

It has already been provided to detect electric arcs from their acoustic signature. Thus, for overhead power lines, an acoustic sensor having a 40-kHz resonance frequency is used and an operator monitors the appearing of an audible signal by means of earphones. Such a method can however not be transposed to a noisy environment, which concerns most of the environments of electric power production, transport, consumption.

Document WO-A-2011090464 provides a method and a device for detecting arcs and their location in electric wires and uses a frequency range from 28 to 32 kHz.

Article "Substation Monitoring by Acoustic Emission Techniques" of ZHAO J et al., published in IEE Proceedings: Science, Measurement and Technology, vol. 148, n° 1, January 2001, describes a technique of acoustic detection of electric arcs capable of occurring in a transformer. The acoustic detection sensor is placed outside of the transformer package and the package is filled with a solid or liquid medium and the waves propagate through the package all the way to the sensor.

Article "The Partial Discharge Locating Experimental Study in Transformer Based on Ultrasonic Phased Array" of CHENGQIANG W et al., published in Power and Energy Engineering Conference (APPEEC), 2012 Asia-Pacific, Mar. 27, 2012, also describes a technique of acoustic detection of the type of detection in a transformer with a sensor external to a package, the waves propagating in a liquid or solid medium.

More recently, the applicant has provided (WO-A-2013150157) a DC electric power source comprising batteries interconnected in a package, an acoustic sensor and a package filling medium having a homogeneous acoustic impedance and used as an acoustic link between the battery interconnects and the sensor. This solution advocates the use of an ultrasound sensor with a bandwidth extending at least from 20 kHz to 150 kHz.

SUMMARY

An embodiment of the present invention aims at overcoming all or part of the disadvantages of known electric arc detection systems.

Another embodiment aims at providing an electric arc detection system more particularly intended for a noisy environment.

Thus, an embodiment provides a method of detecting electric arcs in a chamber defining a volume to be monitored, comprising:

a step of measuring a sound level at frequencies greater than approximately 60 kHz while filtering out the lower frequencies; and a step of comparing said level with a first threshold.

According to an embodiment, said first threshold is determined according to a noise level captured in the absence of electric arcs.

According to an embodiment, the measurement takes into account frequencies in a range from approximately 60 kHz to approximately 300 kHz, preferably in a range from approximately 60 kHz to approximately 150 kHz.

According to an embodiment, the method further comprises a step of comparing, with a second threshold, the result of a correlation between a model of the time response of an electric arc and the measurement.

An embodiment provides an electric arc detection system, comprising:

a chamber defining a volume to be monitored; and an acoustic measurement device filtering out frequencies lower than approximately 60 kHz.

According to an embodiment, the measurement device is sensitive to frequencies contained within a range from approximately 60 kHz to approximately 300 kHz, preferably within a range from approximately 60 kHz to approximately 150 kHz.

According to an embodiment, the measurement device comprises an acoustic sensor.

According to an embodiment, the response of the acoustic sensor excludes frequencies lower than approximately 60 kHz.

According to an embodiment, said device comprises an electronic filter of frequencies lower than approximately 60 kHz.

According to an embodiment, the chamber comprises no openings larger than 5 mm.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
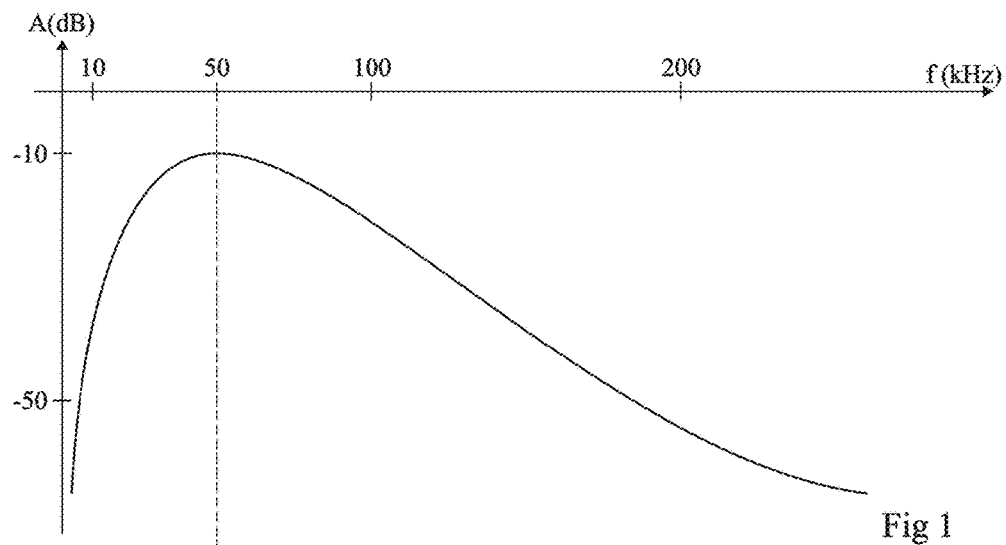
FIG. 1 illustrates an example of spectral response of an electric arc.

The same elements have been designated with the same reference numerals in the different drawings. For clarity, only those elements which are useful to the understanding of the embodiments which will be described have been shown and will be detailed. In particular, the electric devices having their systems detecting the arcs have not been detailed, the described embodiments being compatible with the various power production, transport, and consumption devices. Further, when reference is made to expressions "approximately", "in the order of", or "around", this means to within 10%, and when an identity is mentioned, this means to within technological dispersions.

An electric arc appears in an insulating medium separating two conductive elements at different electric potentials and conducting a current, an electric conduction occurring in the space separating the two conductive elements. The occurrence of an electric arc comes along with an audible or ultrasound acoustic response.

The electric arc detection method and the associated system which will be described originate from a new analysis made by the inventor of the acoustic phenomenon accompanying an electric arc and of the acoustic response of the targeted environments. Conventionally, acoustic detection systems focus either on a wide frequency range, as in document WO-A-2013150157, by varying the surrounding medium, or on a frequency range lower than 40 kHz, as in document WO-A-2011090464.

The other known techniques, based on a propagation in a solid or liquid medium and/or through a package towards a sensor external to the package, are not adapted to applications where mechanical vibrations are likely to occur (a moving vehicle, for example). Indeed, such vibrations risk causing false detections.

Thus, in the embodiments which will be described, an acoustic detection is provided in a gaseous propagation medium, typically air, and microphone-type acoustic sensors detecting vibrations in the air and isolated from mechanical vibrations of contact with the chamber having the microphone(s) placed therein are used.

FIG. 1 schematically shows the acoustic response of an electric arc in air. The inventor has observed that this response may slightly vary according to the medium but that an electric arc, while having a high-level response between approximately 30 kHz and approximately 70 kHz, has a spectrum which extends all the way to 150 kHz, or even beyond, with non negligible levels as compared with the surrounding noise.

The inventors has further observed that, conversely to common belief according to which the environments are made very noisy by signals having frequencies higher than some forty kHz, such noise levels are generally lower than the levels of an electric arc at such frequencies.

Figure 2:
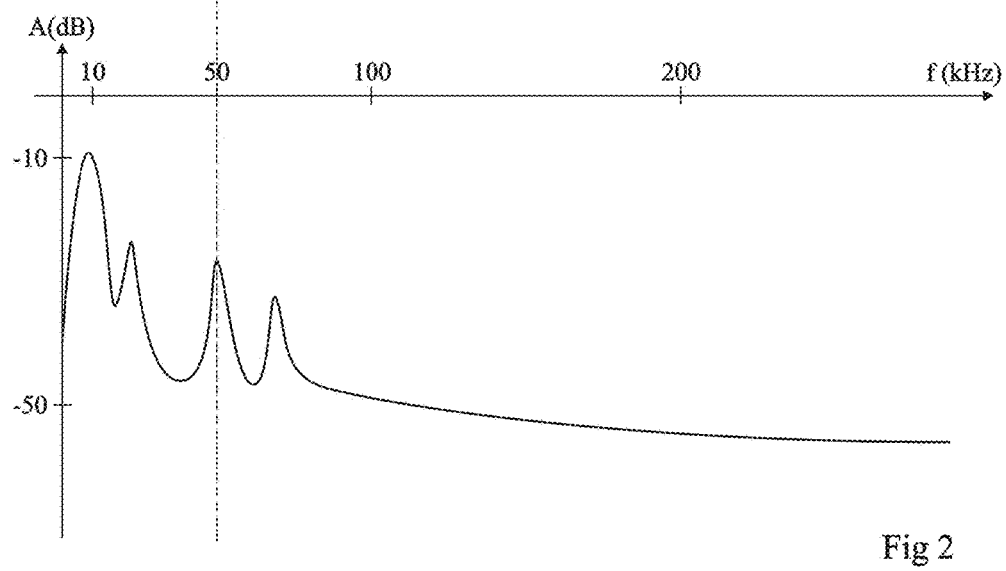
FIG. 2 illustrates an example of a typical ambient noise spectrum, in the environment of an electric system.

FIG. 2 schematically shows the ambient noise spectrum of an environment representative of environments generally encountered in applications where electric arcs are desired to be detected. Actually, the ambient noise is mainly in the audible sound range (below 20 kHz) and, if it has a few peaks at higher frequencies (for example due to switchings of mechanical systems), it generally has an average level much lower than that of an electric arc for frequencies higher than approximately 60 kHz.

In the embodiments which will be described, it is provided to use an acoustic sensor (a microphone) in a chamber where the occurrence of electric arcs is desired to be detected, and to filter out (remove), at the level of the sensor or of the associated electronics of this sensor, frequencies lower than approximately 60 kHz.

Figure 3:
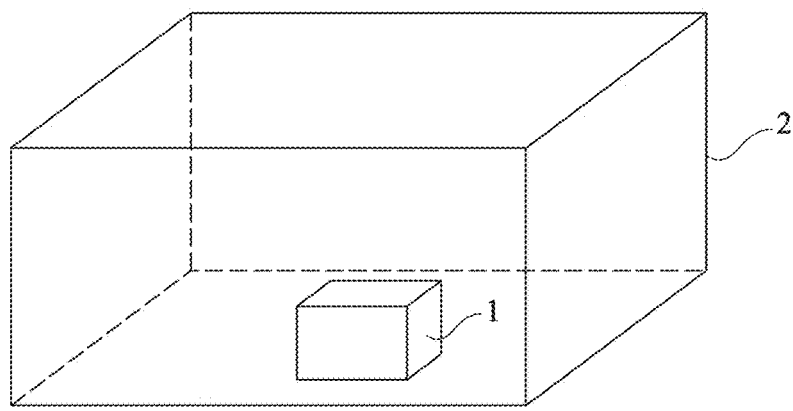
FIG. 3 very schematically shows an embodiment of an electric arc detection system.

FIG. 3 very schematically shows in the form of blocks an embodiment of an electric arc detection system.

An acoustic sensor 1 is placed in a chamber 2 enclosing the volume to be monitored, that is, the electric elements (not shown) capable of causing an electric arc. This volume is not submitted to a particular treatment, that is, it is, in practice, most often formed of ambient air. As a variation, the inner volume of the chamber contains a gas other than air. The walls of chamber 2 attenuate the noise coming from the outside. In the range of audible and ultrasound frequencies up to approximately 60 kHz, such an attenuation is however not sufficient for the amplitude of the acoustic wave to be smaller than that caused by an electric arc within the chamber. However, for frequencies higher than approximately 60 kHz, the level of the ambient noise outside of the chamber is generally sufficiently low for the walls of the chamber to cause a sufficient attenuation. Thus, by filtering the response of the acoustic sensor to remove frequencies lower than approximately 60 kHz, it is possible to tell the ambient noise originating from the outside of the chamber from an electric arc occurring within the chamber.

Further, the performed filtering also enables to do away with the noise generated within the chamber containing the acoustic sensor.

To improve the detection, it may be ascertained that the chamber has no openings, to improve the attenuation of the ambient noise (external to the chamber). In the case where the chamber has openings, it will preferably be ascertained that such openings have dimensions smaller than the main electric arc propagation wavelength, for example, smaller than a few mm, preferably smaller than 4 mm. Thus, it is avoided for the sensor located in the chamber to detect an external arc.

According to the volume to be monitored, a partitioning of this volume into a plurality of closed spaces and a plurality of acoustic sensors (at least one per closed space) may be provided.

Figure 4:
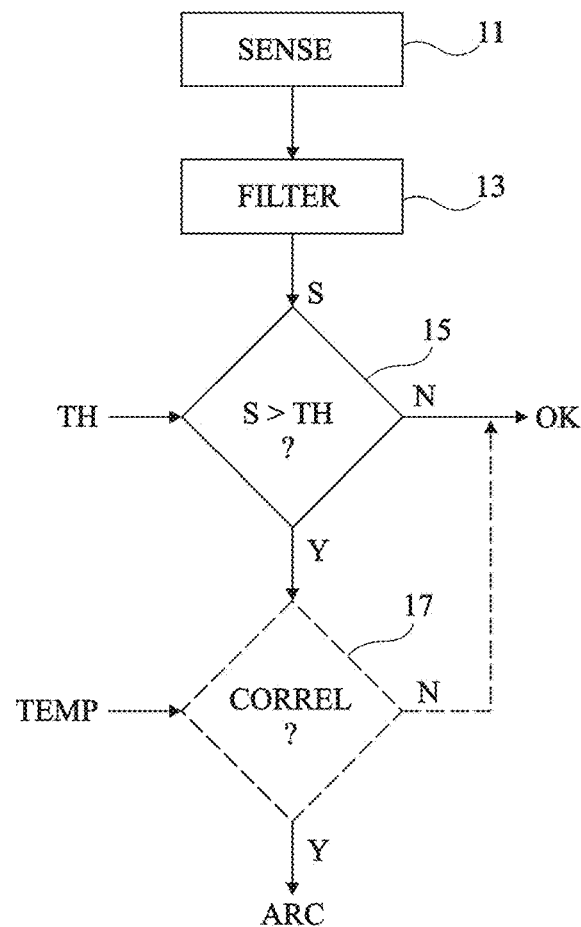
FIG. 4 is a block diagram illustrating an implementation mode of the electric arc detection method.

FIG. 4 is a block diagram illustrating an implementation mode of the electric arc detection method.

The sound amplitude in the considered volume is first measured (block 11, SENSE) by means of an acoustic sensor. It will be ascertained that the microphone is not sensitive to mechanical vibrations, that is, that it is designed to only capture (or to mainly capture) waves propagated by the gaseous medium and to be insensitive to vibrations of its support in contact with the chamber.

Then (or simultaneously if the sensor itself has a response removing frequencies lower than approximately 60 kHz), a high-pass filtering is applied (block 13, FILTER), which filters out frequencies lower than approximately 60 kHz.

The resulting signal S is interpreted by an electronic circuit and is compared (block 15, S>TH?) with a threshold TH.

If the level of signal S is greater than threshold TH (output Y of block 15), it is considered that an electric arc (ARC) is present. According to a first embodiment, in the opposite case (output N of block 15), the situation is considered as normal (OK).

Threshold TH is preferably set by taking into account the surrounding noise, that is, it is selected to be higher than the level of the acoustic signal captured by sensor 1 in the range of frequencies higher than approximately 60 kHz in the absence of an electric arc. Preferably, account is taken of the signals in a frequency range from approximately 60 kHz to approximately 300 kHz, preferably, in a frequency range from approximately 60 kHz to approximately 150 kHz.

Preferably (step 17 CORREL, illustrated in dotted lines in FIG. 4), the determination is refined by comparing, with a second threshold, the result of a correlation between a model (TEMP) of time response of an electric arc and the sensor response. If the sensor response is considered as sufficiently close to the model (output Y of block 17), the presence of an arc is confirmed. For example, this second comparison may be inspired from the technique described in above-mentioned document WO-A-2013150157.

An example of application relates to motor vehicles and, more particularly, to electric vehicles containing a large number of batteries, which increases risks of arcs, due to vibrations, shocks, etc. The chamber where the batteries are generally contained forms a filter sufficient for the outer noise, having a frequency higher than approximately 60 kHz, to be sufficiently filtered so that, within the chamber, an electric arc results in a signal level much higher than the noise on the acoustic sensor.

Figure 5:
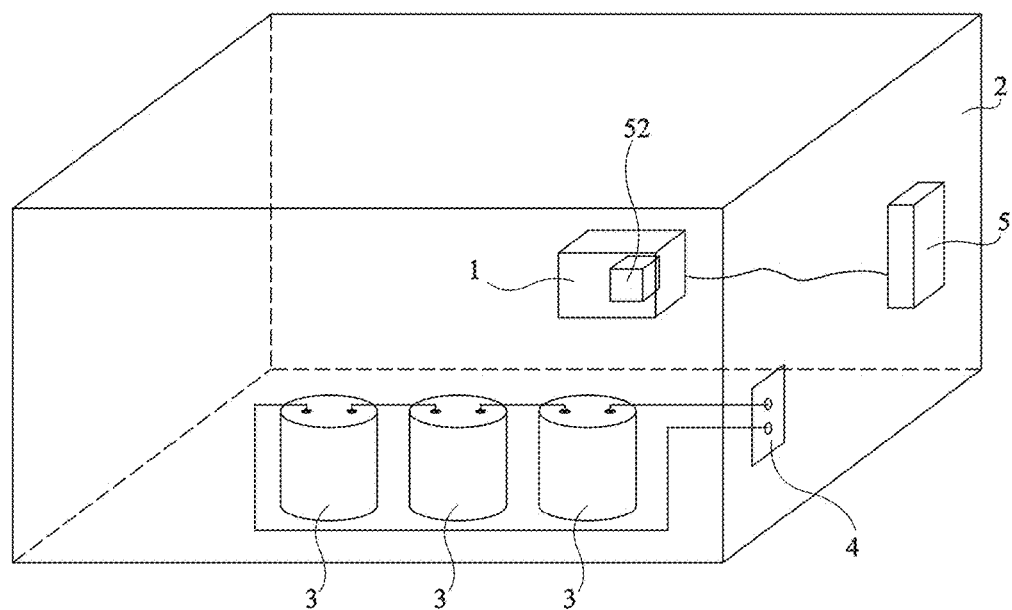
FIG. 5 very schematically shows an example of application of the system of FIG. 3.

FIG. 5 schematically shows in the form of blocks an embodiment of an electric arc detection system according to this example of application.

A chamber 2 having batteries 3 arranged and interconnected therein is considered. A connector 4 (for example, a terminal block), accessible from the outside of chamber 2, enables to connect batteries 3 to their application environment. Chamber 2 also contains an acoustic sensor 1, connected to an electronic device 5, for interpreting the signals captured by the sensor. Device 5 comprises, for example, elements for communicating the detection state or for notifying the presence of an arc (visual, sound, or other alarm).

In the example of FIG. 5, the presence of an acoustic or electronic low-pass filter 52 (cut-off frequency at approximately 60 kHz) is assumed at the level of sensor 1. As a variation, this filter (then electronic) is at the level of device 5.

Another example of application is the detection of electric arcs in a plane and, more particularly, in technical portions of the cockpit. It has been observed that the cockpit forms an obstacle to the ambient noise and that an electric arc will have, in the chamber containing the electric wires, a signal having an amplitude greater than the ambient noise, so that the detection may occur by setting an appropriate threshold. If the signal measured by the sensor (removing frequencies lower than approximately 60 kHz) has an amplitude greater than this threshold, it can be considered that there is a strong risk for an electric arc to be present.

Another example of application relates to electric boards intended to distribute an electric power supply into different circuits. In particular in an industrial environment, vibrations may cause a release of the fastenings of the wires to the different cut-out switches and connectors, which may result in the occurrence of electric arcs. In this application, harmless electric arcs may occur in switches or circuit breakers arranged in the volume to be monitored, during switchings. The packages of such switches or circuit breakers attenuate the amplitude of the acoustic wave caused by the arcs, so that by properly selecting the sensor detection threshold, such "useful" arcs may be told from incidental arcs occurring in the monitored volume.

The fact for the package to be closed and not to give way to acoustic waves directly from the outside air to the air inside of the chamber results in that such acoustic waves from the ambient medium outside of the chamber are greatly filtered out and attenuated at the outer air/chamber interface, and then at the inner air/chamber interface.

Further, even if external mechanical vibrations (for example due to the vibrations of the wheels of a vehicle) which reach the chamber are partly transmitted into the chamber in the gaseous medium and form acoustic waves, such waves are greatly attenuated and partly filtered out (especially frequencies higher than 60 kHz) at the chamber/inner gaseous medium interface. Thus, possible mechanical vibrations originating from an external electric arc are filtered out and greatly attenuated by the chamber/gaseous medium interface and the corresponding residual inner acoustic waves, capable of reaching the inner microphone, have a low amplitude as compared with the amplitude of acoustic waves emitted in the gaseous medium by inner electric arcs.

An advantage of the embodiments which have been described is that it is now possible to detect electric arcs in an acoustically noisy environment.

Another advantage is that the implementation is simple by taking advantage of the chambers which generally surround areas where a detection is desired to be performed. It is thus generally not necessary, in practice, to provide a specific chamber.

Various embodiments have been described, various alterations and modifications will occur to those skilled in the art. In particular, the possible partitionings to be provided and the number of acoustic sensors depend on the volume to be monitored. Further, the practical implementation of the described embodiments is within the abilities of those skilled in the art based on the above functional description, in particular as concerns the forming of the electronic device for interpreting the captured signals and the processing of the detection results. Further, the selection of the values of the detection threshold(s) depends on the application and is also within the abilities of those skilled in the art.

The invention claimed is:

1. A method of detecting electric arcs in a closed chamber, the method comprising:
    a step of measuring a sound level, captured by a microphone inside of the chamber, at frequencies higher than approximately 60 kHz while filtering out lower frequencies than approximately 60 kHz, wherein the chamber comprises no openings larger than 5 mm and defines a gas volume to be monitored; and
    a step of comparing said sound level with a first threshold.

2. The method of claim 1, wherein said first threshold is determined according to a noise level captured in the absence of electric arcs.

3. The method of claim 1, wherein the measurement takes into account the frequencies in a range from approximately 60 Hz to approximately 300 kHz, preferably in a range from approximately 60 kHz to approximately 150 kHz.

4. The method of claim 1, further comprising a step of comparing, with a second threshold, the result of a correlation between a model of the time response of an electric arc and the measurement.

5. An electric arc detection system, comprising:
    a closed chamber, comprising no openings larger than 5 mm, defining a gas volume to be monitored; and
    an acoustic measurement device filtering out frequencies lower than approximately 60 kHz and comprising a microphone inside of the chamber.

6. The system of claim 5, wherein the measurement device is sensitive to frequencies contained within a range from approximately 60 kHz to approximately 300 kHz, preferably within a range from approximately 60 kHz to approximately 150 kHz.

7. The system of claim 5, wherein the response of the microphone excludes frequencies lower than approximately 60 kHz.

8. The system of claim 5, wherein said device comprises an electronic filter of frequencies lower than approximately 60 kHz.

9. The method of claim 1, wherein the microphone is configured to detect vibrations in a gaseous medium inside the chamber.

10. The method of claim 1, wherein the no openings larger than 5 mm attenuate at least one sound originating outside the chamber.

11. The method of claim 1, wherein the chamber includes a plurality of interconnected batteries powering a vehicle.

12. The system of claim 5, wherein the microphone is configured to detect vibrations in a gaseous medium inside the chamber.

13. The system of claim 5, wherein the no openings larger than 5 mm attenuate at least one sound originating outside the chamber.

14. The system of claim 5, wherein the chamber includes a plurality of interconnected batteries powering a vehicle.

* * * * *

UNITED STATES PATENT AND TRADEMARK OFFICE
CERTIFICATE OF CORRECTION

PATENT NO.         : 10,317,454 B2
APPLICATION NO.    : 15/105533
DATED              : June 11, 2019
INVENTOR(S)        : Pierre Perichon Page 1 of 1

It is certified that error appears in the above-identified patent and that said Letters Patent is hereby corrected as shown below:

In the Claims

At Column 6, Claim 3, Line 56, please replace –60 Hz– with "60 kHz".

Signed and Sealed this
Tenth Day of September, 2019

Andrei Iancu
*Director of the United States Patent and Trademark Office*